(12) United States Patent
Yeh et al.

(10) Patent No.: US 8,964,362 B2
(45) Date of Patent: Feb. 24, 2015

(54) HANDHELD ELECTRONIC DEVICE AND SLIDING MECHANISM ASSEMBLY THEREOF

(75) Inventors: Chih-Shan Yeh, Taoyuan County (TW); Yuan-Hung Chang, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 83 days.

(21) Appl. No.: 13/615,663

(22) Filed: Sep. 14, 2012

(65) Prior Publication Data

US 2014/0078649 A1    Mar. 20, 2014

(51) Int. Cl.
*H05K 7/00* (2006.01)
*H04M 1/02* (2006.01)

(52) U.S. Cl.
CPC .............. *H04M 1/0214* (2013.01); *H05K 7/00* (2013.01); *H04M 1/0237* (2013.01); *H04M 1/0216* (2013.01)
USPC ................................. 361/679.01; 455/575.1

(58) Field of Classification Search
USPC .................. 361/679.01, 681, 581; 455/575.1, 455/575.2, 575.3
See application file for complete search history.

(56) References Cited

U.S. PATENT DOCUMENTS

2008/0304217 A1* 12/2008 Lai et al. ...................... 361/681
2010/0149733 A1* 6/2010 Luke et al. ............... 361/679.01
2010/0299873 A1* 12/2010 Song .............................. 16/236

* cited by examiner

*Primary Examiner* — Myron K Wyche
(74) *Attorney, Agent, or Firm* — Jianq Chyun IP Office

(57) ABSTRACT

A handheld electronic device, including a first body, a second body, a sliding module and at least one rotating module. The sliding module is coupled to the second body, so that the second body is suitable for sliding between a first position and a second position. The rotating module is coupled between the first body and the sliding module, so that the second body is suitable for rotating relative to the first body. The second body receives a force to rotate from the second position to a critical position. When the second body passes the critical position, the rotating module releases a potential stored when the second body receives the force to drive the second body to rotate to a third position and form an included angle between the first body and the second body. A sliding mechanism assembly is also disclosed.

13 Claims, 15 Drawing Sheets

HANDHELD ELECTRONIC DEVICE AND SLIDING MECHANISM ASSEMBLY THEREOF

TECHNICAL FIELD

The present invention relates to a handheld electronic device and sliding mechanism assembly thereof, and more particularly to a sliding-lid handheld electronic device and a sliding mechanism assembly thereof.

BACKGROUND

In recent years, with the development of technology, electronic products enable users to acquire needed information anytime in daily lives. On the other hand, since electronic devices gradually develops toward becoming thinner and smaller, demand for handheld electronic devices increases. The handheld devices are electronic products, such as mobile phones and personal digital assistants (PDA), usually having a smaller volume and weight so that the users may carry around easily and hold and manipulate the handheld devices with hand. The handheld devices provide very high conveniences.

Take mobile phones for example. Earlier versions of mobile phones mostly take a stand-up design. To both enhance the carrying convenience of the mobile phones and maintain the dimensions of the screen and keyboard thereof, mobile phones gradually develop body designs with increased utilization dimensions, such as a collapsible design and a sliding-lid design.

In terms of the sliding-lid design, upper and lower bodies thereof are connected to each other through a sliding mechanism, so that the upper and lower bodies slide relatively to render different manipulation states, such as spreading and retracting states, while connecting the upper and lower bodies are connected to prevent from detachment due to sliding. Therefore, the upper and lower bodies have the smallest volume when retracted, and are spread in specific manipulation states to provide a larger utilization dimension.

However, among the prior art, the sliding mechanism of the sliding-lid design is arranged between the upper and lower bodies. Therefore, when the body is spread, the upper and lower bodies are partially overlapped, and part of the utilizable area of the lower body is covered by the upper body. Besides, in order to increase the diversity and convenience in manipulating handheld electronic devices, a rotating mechanism may be incorporated into the sliding-lid design, so that the upper and lower bodies are coupled to each other via a sliding mechanism and the rotating mechanism, in order to realize manual manipulations such as sliding relatively and rotating relatively. However, a mechanism combining sliding and pivoting functions usually has a larger volume and applies a larger restriction to the utilizable room of the handheld electronic devices, i.e. a larger overlapping area exists between the upper and lower bodies, and the position and size of the keyboard, the screen or other elements are restricted. In addition, an over-complicated mechanism design affects the reliability and yield rate of the handheld electronic devices and increases the manufacturing cost of the handheld electronic devices.

SUMMARY

A handheld electronic device is provided herein, having a pivot mechanism with a smaller volume, a simpler design and a positioning function, so that two bodies coupled to the pivot mechanism have a smaller overlapping area, and the handheld electronic device rotates semi-automatically.

A sliding mechanism assembly is further provided herein, suitable for being coupled between two objects, so that the sliding mechanism assembly rotates semi-automatically.

For a concrete description of the disclosure, a handheld electronic device is introduced herein, including a first body, a second body, a sliding module and at least one rotating module. The sliding module is coupled to the second body, wherein the second body is suitable for sliding between a first position and a second position via the sliding module. The rotating module is coupled between the first body and the sliding module, and the second body is suitable for rotating relative to the first mechanism via the rotating module, wherein the second body is suitable for receiving a force in order to rotate from the second position to a critical position, and the rotating module is suitable for receiving a force in order to store a potential. When the second body passes the critical position, the rotating module is suitable for releasing the potential to drive the second body to rotate from the critical position to a third position and form an included angle between the first body and the second body.

According to an embodiment of the disclosure, the second body is suitable for rotating relative to the first body along an axis. Each of the rotating modules includes a first axle rod, a first positioning cam, a rotating cam, a first elastic member and a first link rod. The first axle rod is configured on the first body, and the extending direction thereof is parallel to the axis. The first positioning cam is disposed on the first axle rod, and the first positioning cam has a first positioning portion. The first rotating cam is disposed on the first axle rod, wherein the first rotating cam has a first mating surface facing the first positioning portion and a second positioning portion on the first mating surface, and the second positioning portion is configured to be coordinated with the first positioning portion. The first elastic member is coupled to the first positioning cam. The first link rod is coupled between the first rotating cam and the sliding module.

When the second body rotates from the second position to the critical position, the first link rod drives the first rotating cam to rotate along the first axle rod, and the second positioning portion and the first positioning portion are dislocated with each other in order to push the first positioning cam away from the first rotating cam, so that the first elastic member stores a first elastic potential. When the second body passes the critical position, the first elastic member is suitable for releasing the first elastic potential in order to reposition the first positioning cam and drive the first positioning portion and the second positioning portion to a coordinated state, so that the first rotating cam continues rotating along the first axle rod to drive the second body to rotate from the critical position to the third position via the first link rod.

According to an embodiment of the disclosure, the rotating module further includes a second axle rod, a second positioning cam, a second rotating cam, a second elastic member and a second link rod. The second axle rod is configured on the first body, and the extending direction thereof is parallel to the axis. The second positioning cam is disposed on the second axle rod, and the second positioning cam has a third positioning portion. The second rotating cam is disposed on the second axle rod, wherein the second rotating cam has a second mating surface facing the third positioning portion and a fourth positioning portion on the second mating surface, and the fourth positioning portion is configured to be coordinated with the third positioning portion. The second elastic member is coupled to the second positioning cam. The second link rod is coupled between the second rotating cam and the sliding module.

When the second body rotates from the second position to the critical position, the second link rod drives the second rotating cam to rotate along the second axle rod, and the fourth positioning portion and the third positioning portion are dislocated with each other to push the second positioning cam away from the second rotating cam, so that the second elastic member stores a second elastic potential. When the second body passes the critical position, the second elastic member is suitable for releasing the second elastic potential in order to reposition the second positioning cam and drive the third positioning portion and the fourth positioning portion to a coordinated state, so that the second rotating cam continues rotating along the second axle rod to drive the second body to rotate from the critical position to the third position via the second link rod and the first link rod together.

According to an embodiment of the disclosure, the second elastic member includes a helical spring, disposed on the second axle rod.

According to an embodiment of the embodiment, a direction of a force applied to the second positioning cam by the second elastic member is substantially parallel to the axis.

According to an embodiment of the disclosure, the first elastic member includes a helical spring, disposed on the first axle rod.

According to an embodiment of the embodiment, a direction of a force applied to the first positioning cam by the first elastic member is substantially parallel to the axis.

According to an embodiment of the disclosure, the sliding module includes a fixing part and a moving part. The fixing part is pivotally connected to the link rod. The moving part is connected to the second body, and is slidingly coupled to the fixing part.

According to an embodiment of the disclosure, the fixing part has two opposite grooves, and the moving part is slidingly engaged in the two grooves.

A handheld electronic device is further introduced herein, including a first body, a second body, a sliding module, two rotating modules and a linking-up axle rod. The sliding module is the sliding module in the above. The two rotating modules are arranged on two opposite sides of the first body, and are coupled between the first body and the sliding module, wherein the second body is suitable for rotating relative to the first body via the two rotating modules. The linking-up axle rod is configured on the first body and is coupled to the two rotating modules. The second body is suitable for receiving a force in order to rotate from the second position to a critical position, and the two rotating modules are suitable for actuating synchronously via the linking-up axle rod to receive a force and store a potential. When the second body passes the critical position, the two rotating modules are suitable for releasing the potential to drive the second body together to rotate from the critical position to a third position and form an included angle between the first body and the second body.

According to an embodiment of the disclosure, the second body is suitable for rotating relative to the first body along an axis, and an extending direction of the linking-up axle rod is parallel to the axis. Each of the rotating modules includes a first positioning cam, a first rotating cam, a first elastic member and a first link rod. The first positioning cam and the first rotating cam are the first positioning cam and the first rotating cam in the above, disposed on the linking-up axle rod respectively. The first elastic member is coupled to the first positioning cam. The first link rod is coupled between the first rotating cam and the sliding module.

When the second body rotates from the second position to the critical position, the first link rod drives the first rotating cam to rotate along the linking-up axle rod, and the second positioning portion and the first positioning portion are dislocated with each other in order to push the first positioning cam away from the first rotating cam, so that the first elastic member stores a first elastic potential. When the second body passes the critical position, the first elastic member is suitable for releasing the first elastic potential in order to reposition the first positioning cam and drive the first positioning portion and the second positioning portion to a coordinated state, so that the first rotating cam continues rotating along the linking-up axle rod to drive the second body to rotate from the critical position to the third position via the first link rod.

According to an embodiment of the disclosure, the rotating module further includes a second axle rod, a second positioning cam, a second rotating cam, a second elastic member and a second link rod, and the second axle rod, the second positioning cam, the second rotating cam, the second elastic member and the second link rod are the second axle rod, the second positioning cam, the second rotating cam, the second elastic member and the second link rod in the above.

When the second body rotates from the second position to the critical position, the second link rod drives the second rotating cam to rotate along the second axle rod, so that the fourth positioning portion and the third positioning portion are dislocated with each other in order to push the second positioning cam away from the second rotating cam, so that the second elastic member stores a second elastic potential. When the second body passes the critical position, the second elastic member is suitable for releasing the second elastic potential in order to reposition the second positioning cam and drive the third positioning portion and the fourth positioning portion to a coordinated state, so that the second rotating cam continues rotating along the second axle rod to drive the second body to rotate from the critical position to the third position via the first link rod and the second link rod together.

A sliding mechanism assembly is further introduced herein, suitable for being coupled between a first object and a second object, wherein the sliding mechanism assembly includes a sliding module and at least one rotating module. The sliding module is coupled to the second object, wherein the second object is suitable for sliding between a first position and a second position via the sliding module. The sliding module is coupled between the first object and the sliding module, and the second object is suitable for rotating relative to the first object via the rotating module, wherein the second object is suitable for receiving a force in order to rotate from the second position to a critical position, and the rotating module is suitable for receiving the force to store a potential. When the second object passes the critical position, the rotating module is suitable for releasing the potential to drive the second object to rotate from the critical position to a third position and form an included angle between the first object and the second object.

According to an embodiment of the disclosure, the second object is suitable for rotating relative to the first object along an axis. Each of the rotating modules includes a first axle rod, a first positioning cam, a first rotating cam, a first elastic member and a first link rod. The first axle rod is configured on the first object, and the extending direction thereof is parallel to the axis. The first positioning cam is disposed on the first axle rod, and the first positioning cam has a first positioning portion. The first rotating cam is disposed on the first axle rod, wherein the first rotating cam has a first mating surface facing the first positioning portion and a second positioning portion on the first mating surface, and the second positioning portion is configured to be coordinated with the first positioning portion. The first elastic member is coupled to the first positioning cam. The first link rod is coupled between the first rotating cam and the sliding module.

When the second object rotates from the second position to the critical position, the first link rod drives the first rotating cam to rotate along the first axle rod, and the second positioning portion and the first positioning portion are dislocated with each other in order to push the first positioning cam away from the first rotating cam, so that the first elastic member stores a first elastic potential. When the second object passes the critical position, the first elastic member is suitable for releasing the first elastic potential to reposition the first positioning cam and drive the first positioning portion and the second positioning portion to a coordinated state, so that the first rotating cam continues rotating along the first axle rod to drive the second object to rotate from the critical position to the third position via the first link rod.

According to an embodiment of the disclosure, the rotating module further includes a second axle rod, a second positioning cam, a second rotating cam, a second elastic member and a second link rod. The second axle rod is configured on the first object, and the extending direction thereof is parallel to the axis. The second positioning cam is disposed on the second axle rod, and the second positioning cam has a third positioning portion. The second rotating cam is disposed on the second axle rod, wherein the second rotating cam has a second mating surface facing the third positioning portion and a fourth positioning portion on the second mating surface, and the fourth positioning portion is configured to be coordinated with the third positioning portion. The second elastic member is coupled to the second positioning cam. The second link rod is coupled between the second rotating cam and the sliding module.

When the second object rotates from the second position to the critical position, the second link rod drives the second rotating cam to rotate along the second axle rod, and the fourth positioning portion and the third positioning portion are dislocated with each other in order to push the second positioning cam away from the second rotating cam, so that the second elastic member stores a second elastic potential. When the second object passes the critical position, the second elastic member is suitable for releasing the second elastic potential in order to reposition the second positioning cam and drive the third positioning portion and the fourth positioning portion to a coordinated state, so that the second rotating cam continues rotating along the second axle rod to drive the second object to rotate from the critical position to the third position via the second link rod and the first link rod together.

According to an embodiment of the disclosure, the first link rod is coupled to the sliding module and the first rotating cam respectively via a first pivot axis and a second pivot axis, the second link rod is coupled to the sliding module and the second rotating cam respectively via a third pivot axis and a fourth pivot axis, and the distance between the first pivot axis and the second pivot axis is larger than the distance between the third pivot axis and the fourth pivot axis.

According to an embodiment of the disclosure, the number of the rotating modules is two, arranged on two opposite sides of the first body respectively, and the two rotating modules share a same first axle rod.

Based on the above, a handheld electronic apparatus is introduced herein, driving a rotating cam to rotate along an axle rod via a link rod to push a positioning cam, so that the positioning cam compresses an elastic member to store an elastic potential. After the elastic member releases the elastic potential and the positioning cam is repositioned, the positioning cam pushes the rotating cam to continue rotating along the axle rod automatically, in order to drive the second body via the link rod to rotate automatically. A sliding mechanism assembly is further provided herein, suitable for being coupled between two objects, so that the sliding mechanism assembly rotates semi-automatically. Thereby, the sliding mechanism assembly provides a pivot mechanism with a small volume and a simple design to the handheld electronic apparatus, so that two bodies coupled to the pivot mechanism have a smaller overlapping area, and the second body is rotated semi-automatically with a positioning function of the pivot mechanism.

In order to make the aforementioned features and advantages of the disclosure more comprehensible, embodiments accompanied with figures are described in detail below.

BRIEF DESCRIPTION OF THE DRAWINGS

The accompanying drawings are included to provide further understanding and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
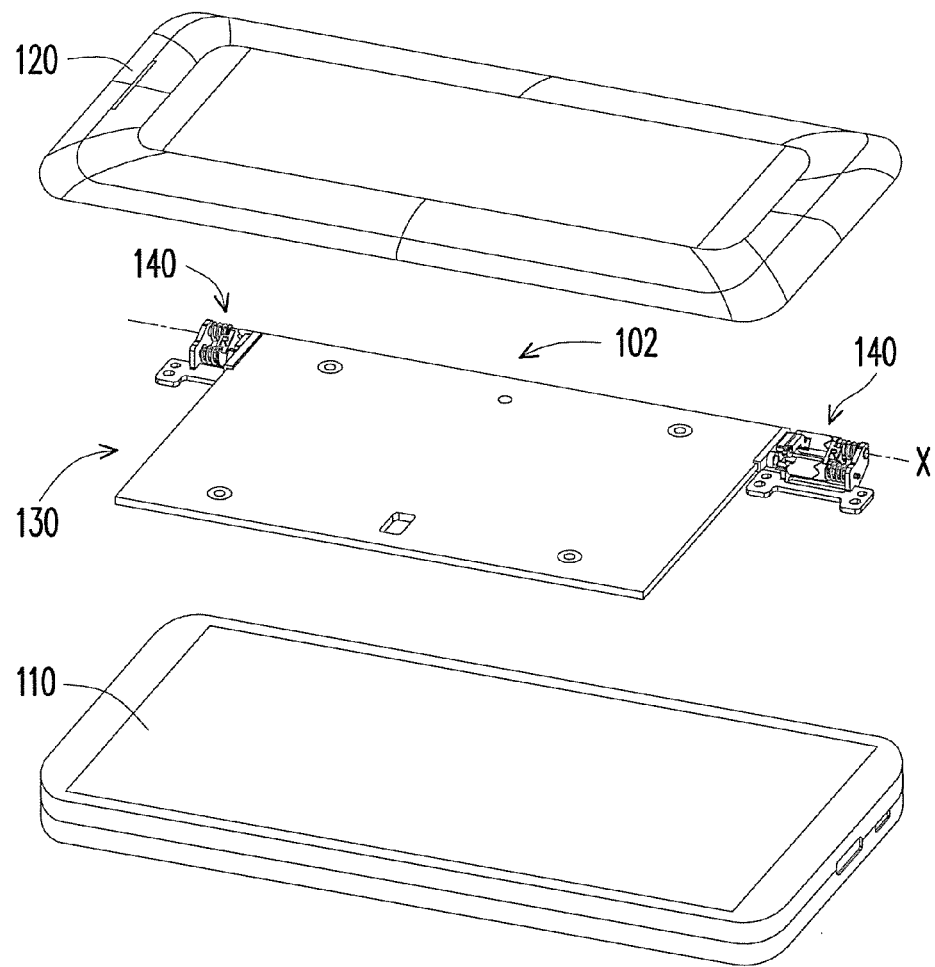
FIG. 1 is an exploded view of a handheld electronic device according to an embodiment of the disclosure.

FIG. 1 is an exploded view of a handheld electronic device according to an embodiment of the disclosure. Referring to FIG. 1, the handheld electronic device 100 in the embodiment includes a first body 110, a second body 120 and a sliding mechanism assembly 102. The sliding mechanism assembly 102 includes a sliding module 130 and a rotating module 140, suitable for being coupled between a first object (not shown) and a second object (not shown). Therefore, in the embodiment, the first object is a first body 110, and the second object is a second body 120. Nevertheless, the disclosure is not limited thereto. When the sliding mechanism assembly 102 is applied to other apparatus, the first object and the second object may be other members or apparatus. For instance, the first object may be a cover plate, and the second object may be an electronic device, wherein the sliding mechanism assembly is coupled between the two.

In the embodiment, the handheld electronic device 100 includes the first body 110, the second body 120, the sliding module 130 and two rotating modules 140. Therefore, please refer to the detailed description of the handheld electronic apparatus 100 about the connection relationship and operation between the first body 110, the second body 120, the sliding module 130 and the rotating modules 140 for the operation of the sliding mechanism assembly 102 between the first object and the second object.

More concretely, the sliding module 130 is coupled to the second body 120, so that the second body 120 slides relative to the first body 110 via the sliding module 130. On the other hand, the two rotating modules 140 are arranged on two opposite sides of the first body 110, and are coupled between the first body 110 and the sliding module 130, wherein the second body 120 rotates relative to the first body 110 via the two rotating modules 140 along an axis X. Certainly, the disclosure does not restrict on the number of rotating modules 140. In other embodiments, the handheld electronic device 100 may include one or more than two rotating modules 140.

Figure 2:
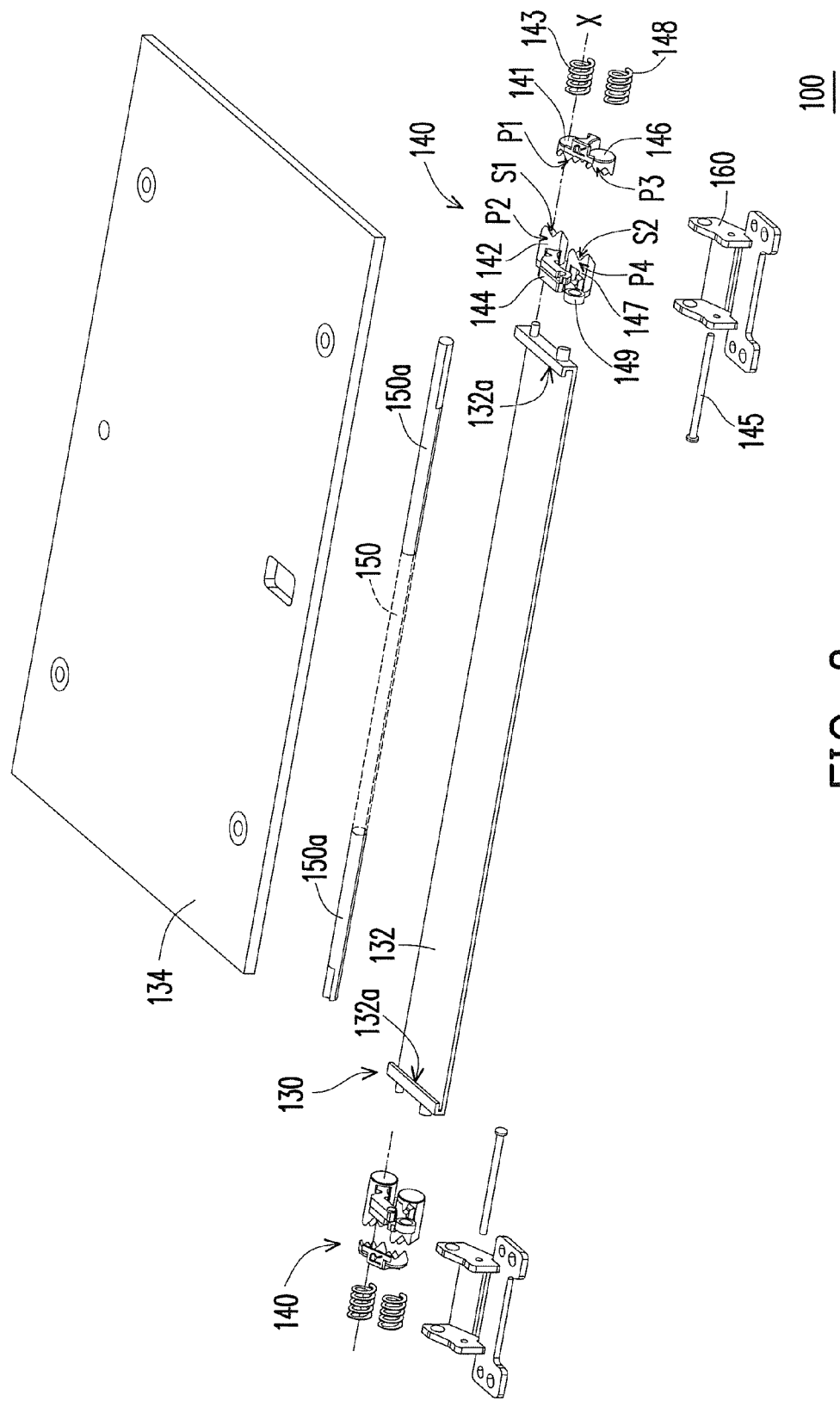
FIG. 2 is an exploded view of a sliding module and a rotating module of FIG. 1.
Figure 3:
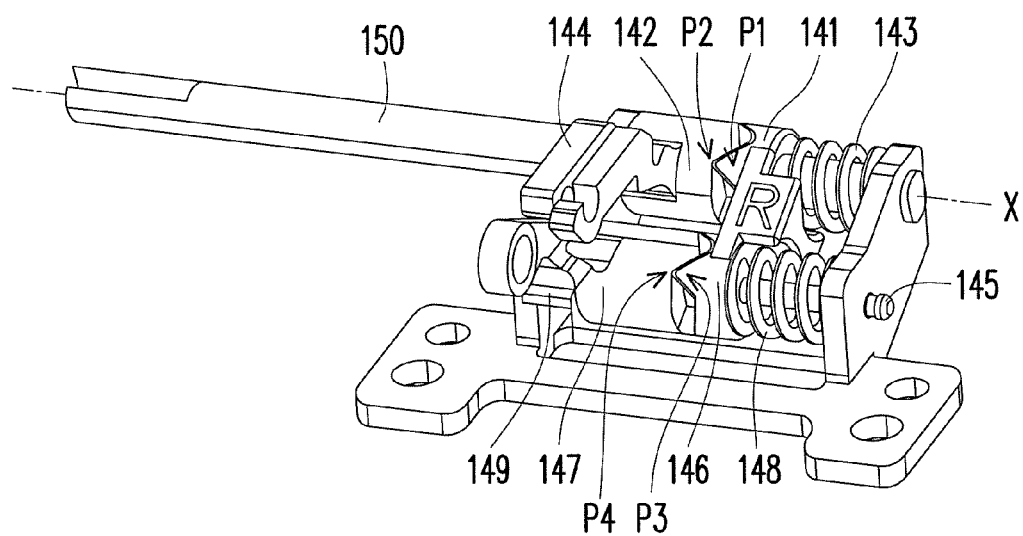
FIG. 3 is an enlarged view of the rotating module of FIG. 1.

FIG. 2 is an exploded view of the sliding module and the rotating module of FIG. 1. FIG. 3 is an enlarged view of the rotating module of FIG. 1. FIG. 2 illustrates the rotating module 140 arranged on one side of the first body 110 in an exploded view. Referring to FIGS. 2 and 3, the handheld electronic apparatus 100 in the embodiment has a linking-up axle rod 150, arranged on the first body 110 and coupled to the two rotating modules 140 arranged on the two opposite sides of the first body 110, so that the two rotating modules 140 rotate synchronously. However, in other embodiments, a first axle rod 150a may be arranged on the two rotating modules 140 of the handheld electronic apparatus 100 respectively. Therefore, the linking-up axle rod 150 can be deemed as being formed by connecting two first axle rods 150a.

FIG. 2 illustrates both the first axle rod 150a and the linking-up axle rod 150 for contrasting the first axle rod 150a with the linking-up axle rod 150. The first axle rods 150a are configured on the first body 110 respectively, so that the two rotating modules 140 rotate respectively, but the disclosure is not limited thereto. Besides a linking-up function, the first axle rod 150a and the linking-up axle rod 150 have similar operations. Please refer to a detailed description of the linking-up axle rod 150 below.

The handheld electronic device 100 has a base 160, secured on the first body 110, and the rotating module 140 is arranged on the base 160. Since the handheld electronic apparatus 100 in the embodiment has two rotating modules 140, the handheld electronic apparatus 100 has two bases 160, so that the rotating modules 140 are arranged on the bases 160 correspondingly and respectively. The linking-up axle rod 150 is coupled between the two bases 160, and the extending direction of the linking-up axle rod 150 is parallel to the axis X, so that the linking-up axle rod 150 rotates relative to the first body 110.

Thereby, the two rotating modules 140 rotate synchronously to drive the second body 120 to rotate relative to the first body 110 without skewing. In other words, the handheld electronic apparatus 100 in the embodiment serially connect all of the rotating modules 140 via the linking-up axle rod 150 to actuate all of the rotating modules 140 synchronously, so that the second body 120 rotates relative to the first body 110 stably.

More specifically, each of the rotating modules 140 includes a first positioning cam 141, a first rotating cam 142, a first elastic member 143 and a first link rod 144. In the embodiment, the first positioning cam 141 is disposed on the linking-up axle rod 150, and the first positioning cam 141 has a first positioning portion P1. The first rotating cam 142 is disposed on the linking-up axle rod 150, wherein the first rotating cam 142 has a first mating surface S1 facing the first positioning portion P1 and a second positioning portion P2 on the first mating surface S1, and the second positioning portion P2 is configured to be coordinated with the first positioning portion P1.

In addition, the first elastic member 143 is coupled to the first positioning cam 141. In the embodiment, the first elastic member 143 is a helical spring, disposed on the linking-up axle rod 150, but the disclosure does not restrict on the variety of the first elastic member 143. The first link rod 144 is coupled between the first rotating cam 142 and the sliding module 130. When the rotating module 140 rotates along the axis X, the first link rod 144 drives the sliding module 130 so that the second body 120 rotates relative to the first body 110.

Besides, in the embodiment, the rotating module 140 further includes a second axle rod 145, a second positioning cam 146, a second rotating cam 147, a second elastic member 148 and a second link rod 149. The second axle rod 145 is arranged on the first body 110, and the extending direction of the second axle rod 145 is parallel to the axis X.

More specifically, in the embodiment, the second axle rod 145 is pivotally connected to the base 160, so that the second axle rod 145 rotates relative to the first body 110. However, in other embodiments, the second axle rod 145 may be fixed on the base 160, and the disclosure is not limited thereto. The second positioning cam 146 is disposed on the second axle rod 145, and the second positioning cam 146 has a third positioning portion P3. The second rotating cam 147 is disposed on the second axle rod 145, wherein the second rotating cam 147 has a second mating surface S2 facing the third positioning portion P3 and a fourth positioning portion P4 on the second mating surface S2, and the fourth positioning portion P4 is configured to be coordinated with the third positioning portion P3.

The second elastic member 148 is coupled to the second positioning cam 146. In the embodiment, the first elastic member 148 is a helical spring, disposed on the linking-up axle rod 145, but the disclosure does not restrict on the variety of the second elastic member 148. The second link rod 149 is coupled between the second rotating cam 147 and the sliding module 130. When the rotating module 140 rotates along the axis X, the second link rod 149 drives the sliding module 130 so that the second body 120 rotates relative to the first body 110.

On the other hand, referring to FIG. 2, the sliding module 130 in the embodiment includes a fixing part 132 and a moving part 134. The moving part 134 is connected to the second body 120, and is slidingly coupled to the fixing part 132. The fixing part 132 has two opposite grooves 132a, so that the moving part 134 is slidingly engaged with the two grooves 132a. Besides, the fixing part 132 is pivotally connected to the first link rod 144 and the second link rod 149 of the two rotating modules 140. Thereby, when the rotating module 140 rotates along the axis X, the first link rod 144 and the second link rod 149 drive the sliding module 130 so that the second body 120 rotates relative to the first body 110.

However, in other embodiments of the disclosure, under the condition that the normal operation of the rotating module 140 is not affected, the second axle rod 145, the second positioning cam 146, the second rotating cam 147, the second elastic member 148 and the second link rod 149 may be omitted, i.e. to adopt one single link rod and cam group for coupling the first body 110 to the sliding module 130.

FIGS. 4A-4D sequentially illustrate schematic diagrams of the handheld electronic apparatus 100 of FIG. 1 from a retracting state turning into an spreading state. Referring to FIGS. 4A-4D, in the embodiment, users may transform the handheld electronic apparatus 100 from the retracting state into the spreading state by applying a force F to the second body 120 of the handheld electronic apparatus 100, and push the second body 120 to rotate relative to the first body 110 to open and manipulate the handheld electronic apparatus 100.

Figure 4A:
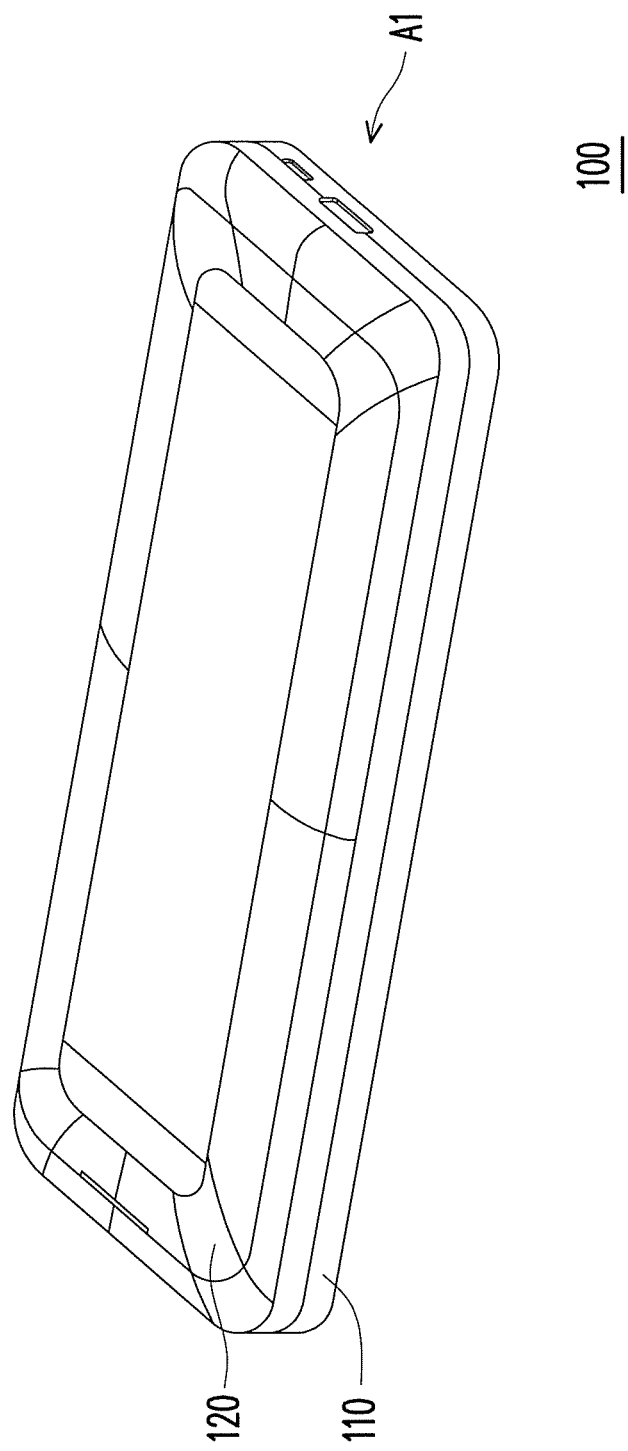
FIGS. 4A-4D sequentially illustrate schematic diagrams of the handheld electronic apparatus of FIG. 1 from a retracting state turning into an spreading state.
Figure 4B:
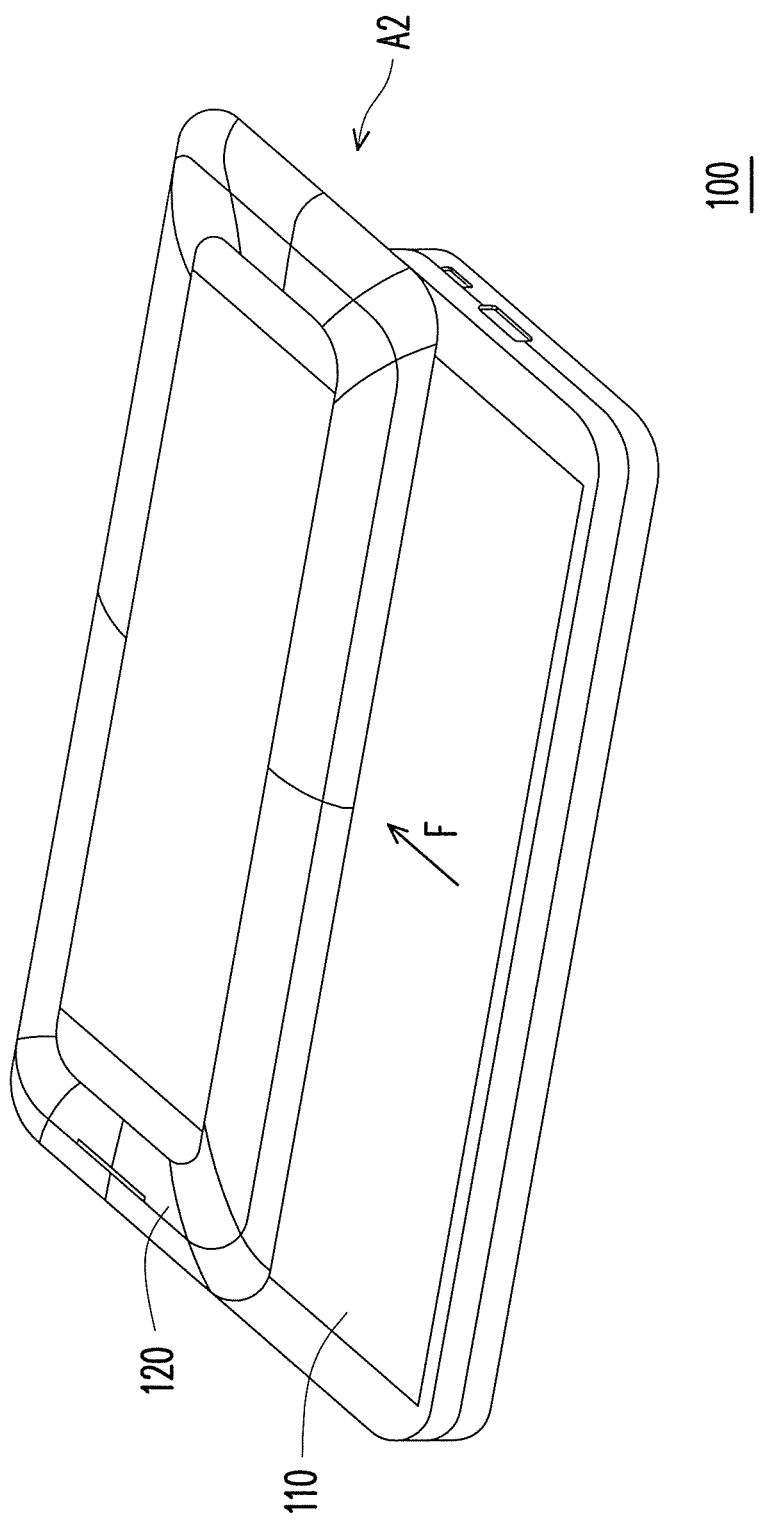
Figure 4C:
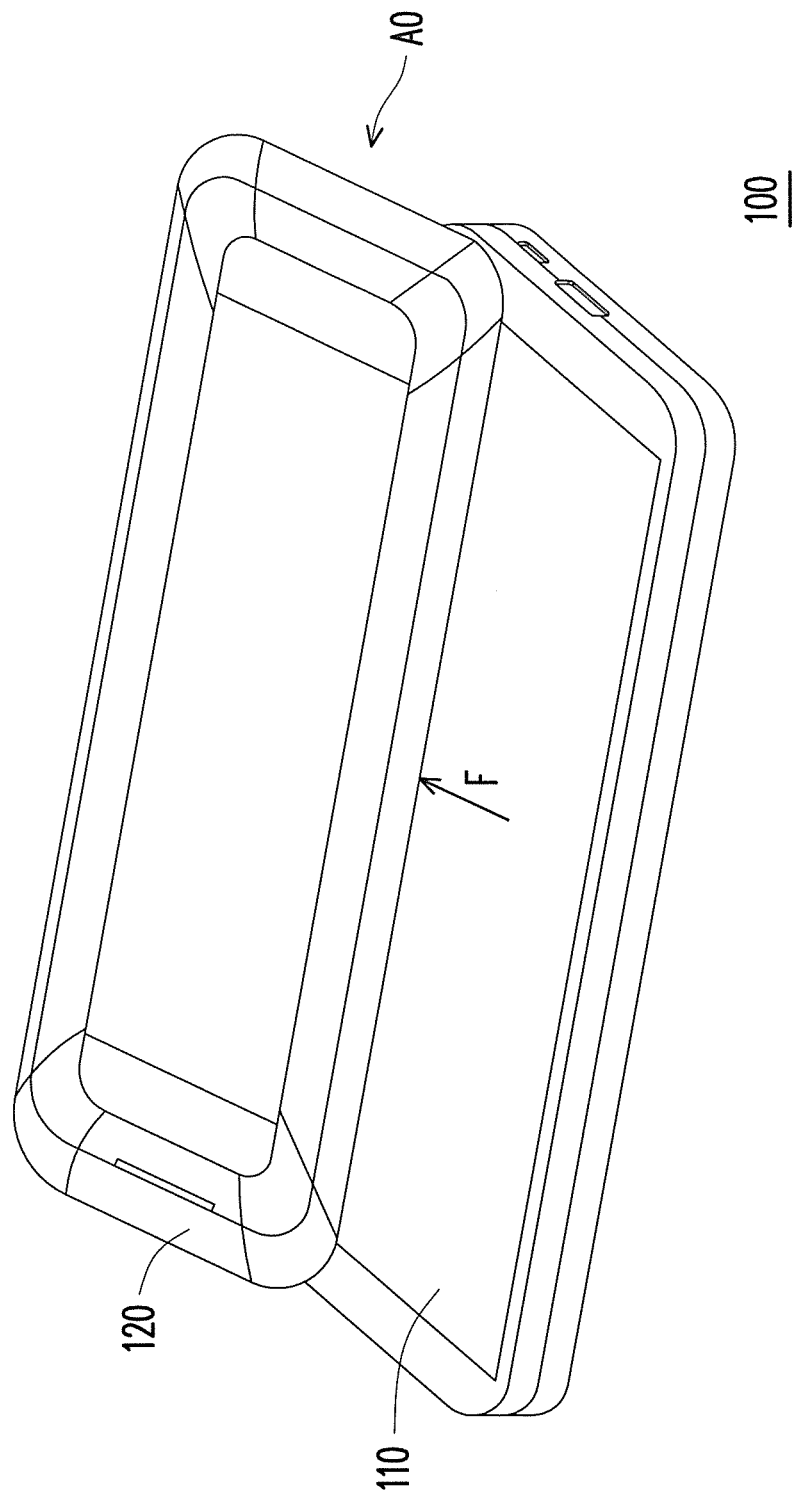
Figure 4D:
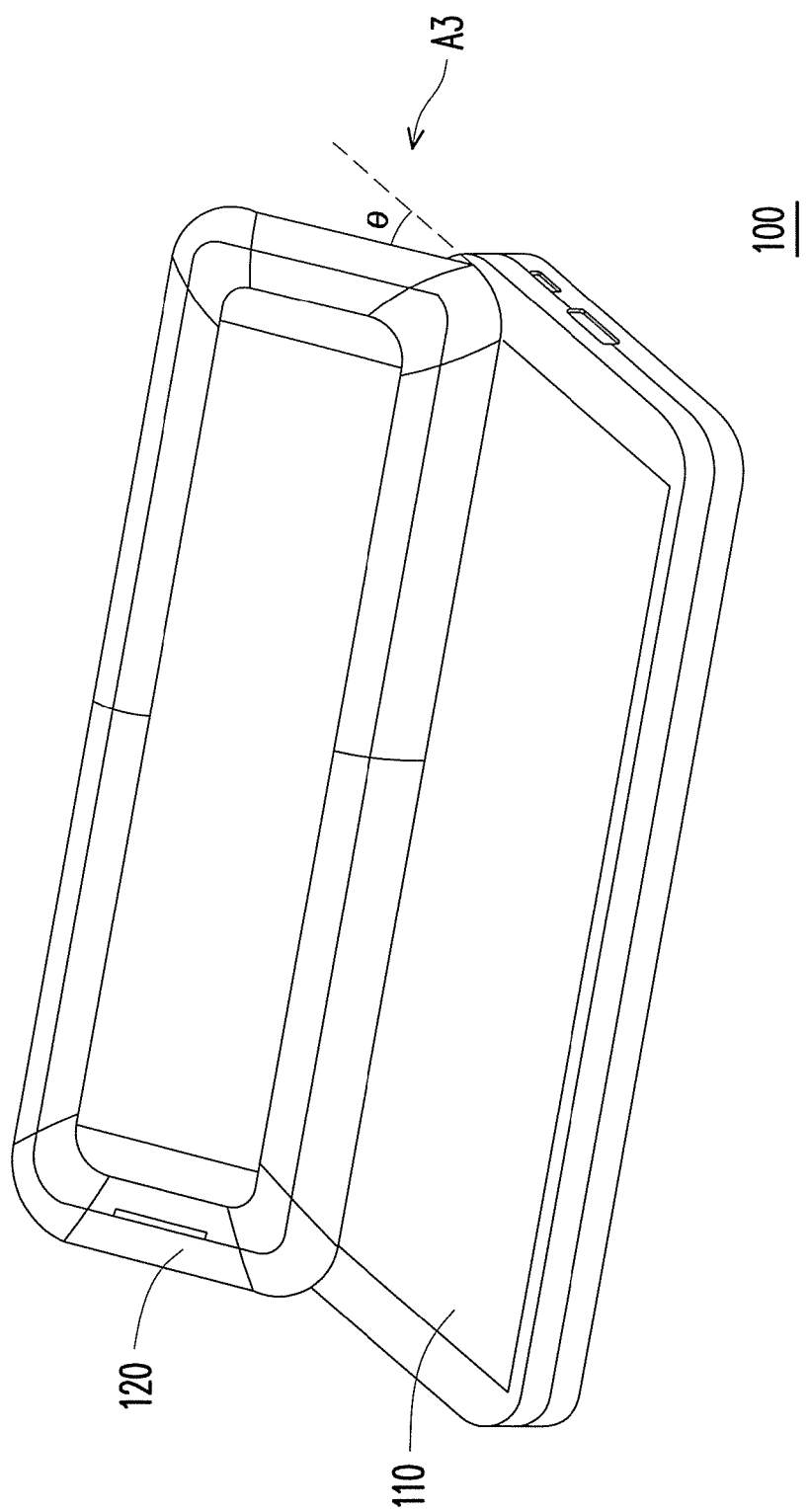
Figure 5A:
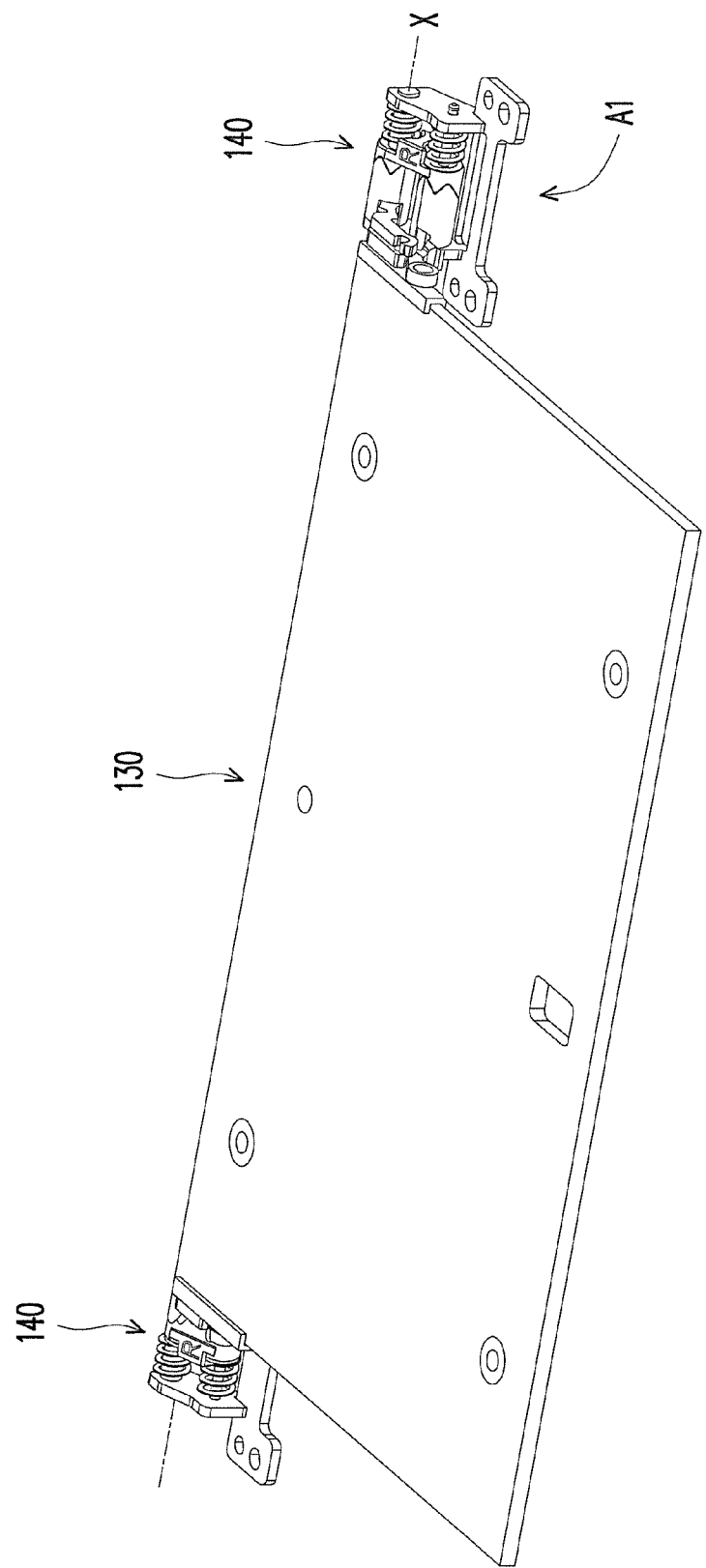
FIGS. 5A-5D illustrate operations of the rotating module and a sliding module in the states as shown in FIGS. 4A-4D respectively.
Figure 5B:
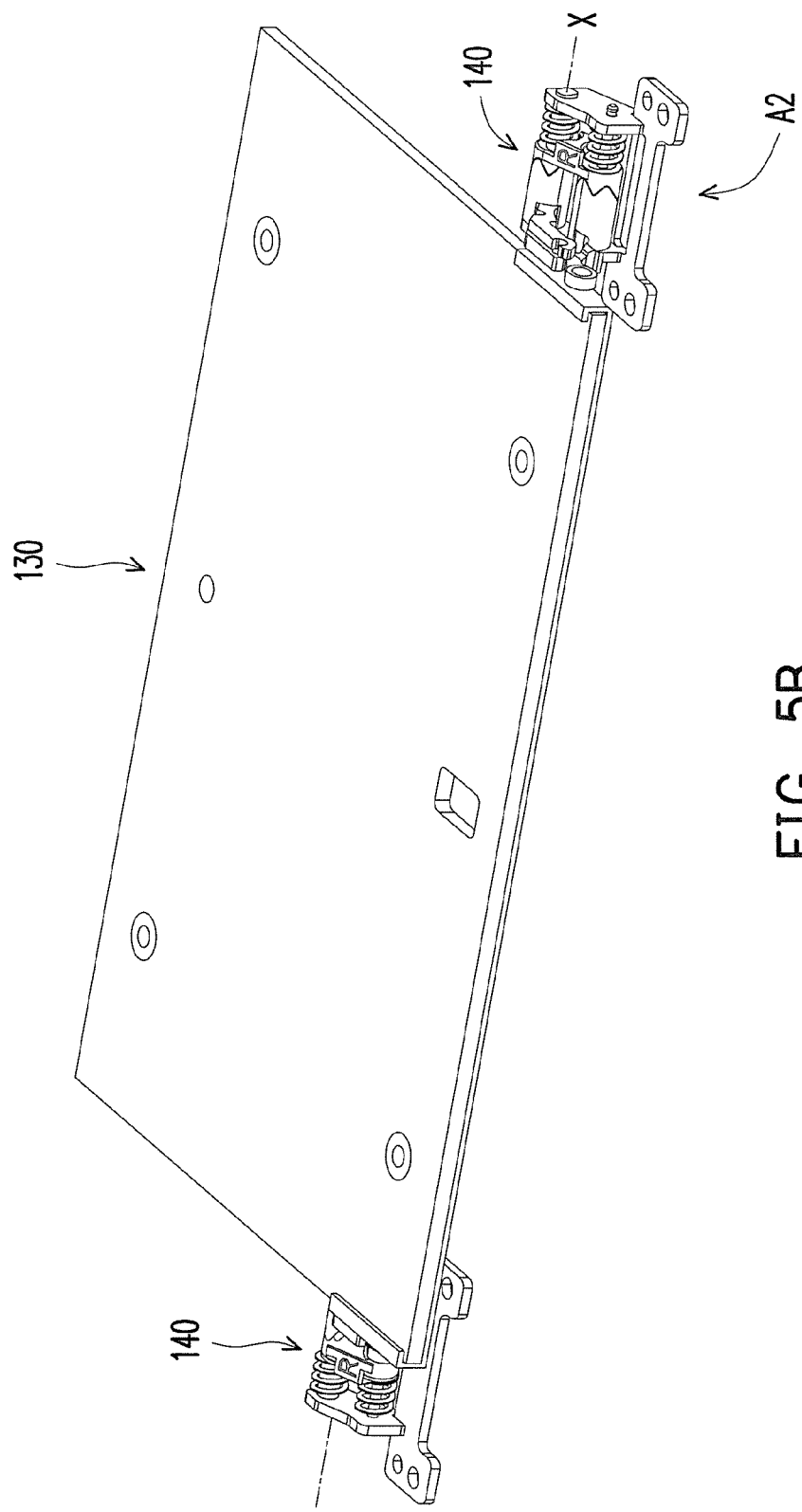
Figure 5C:
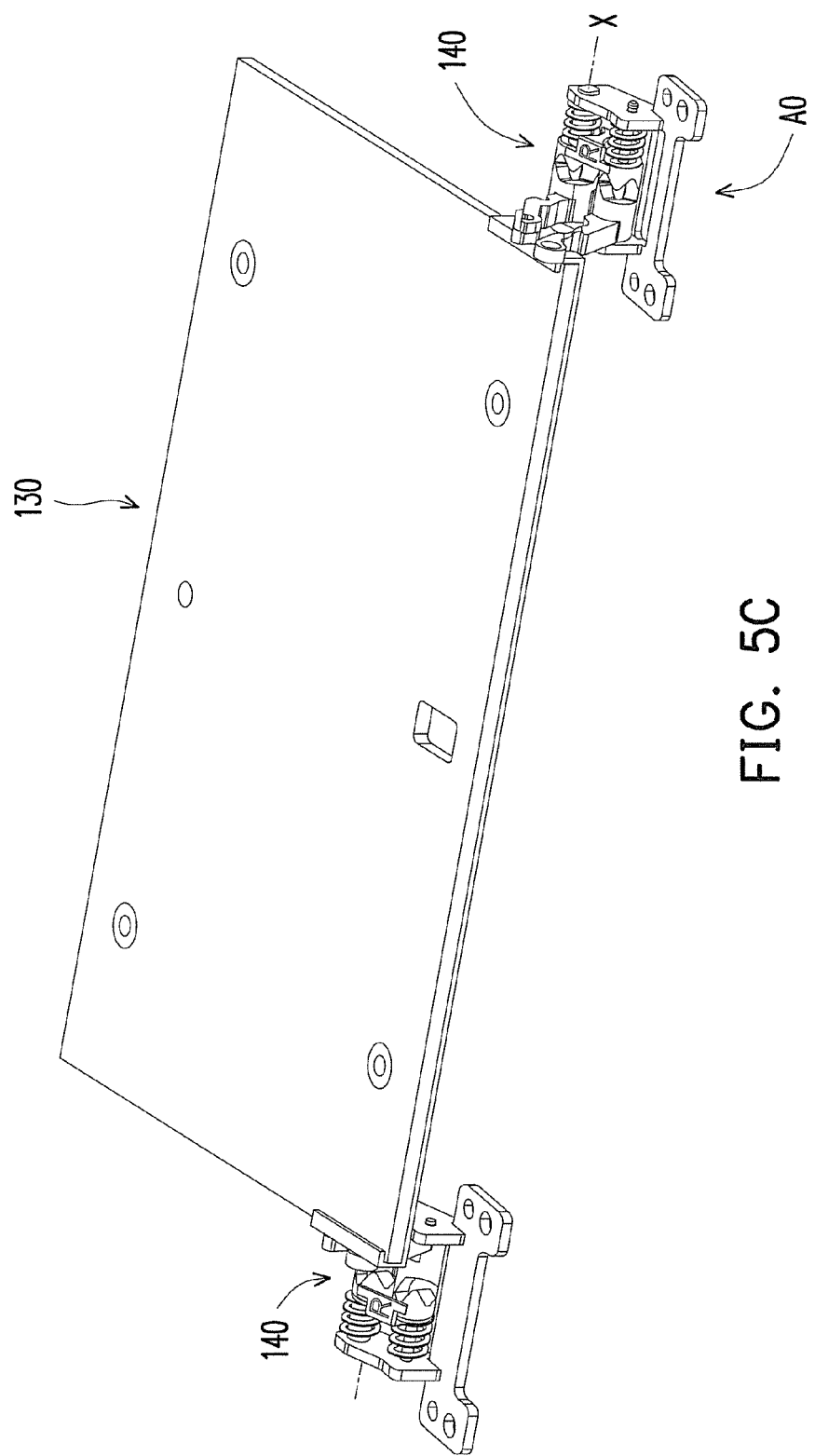
Figure 5D:
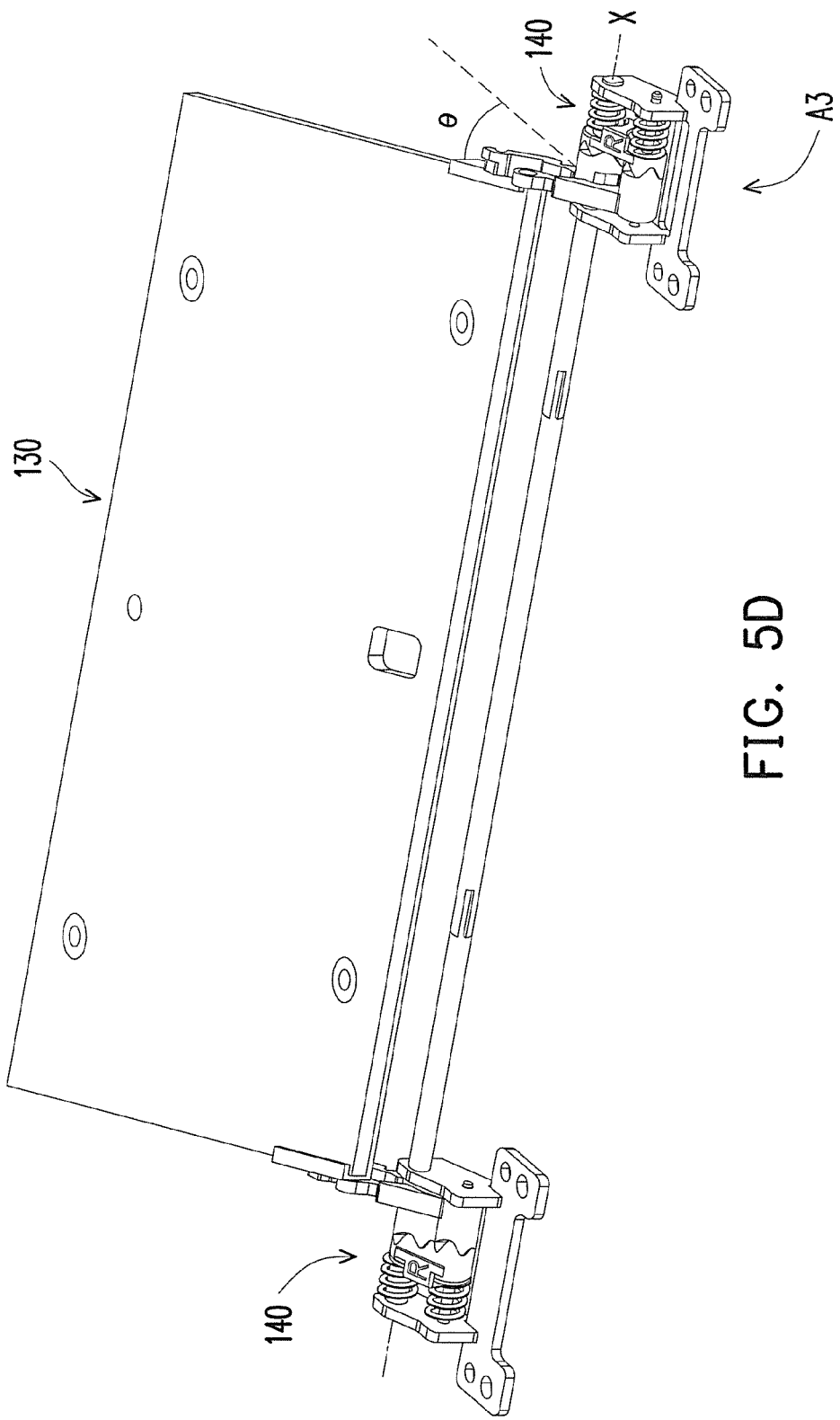
Figure 6A:
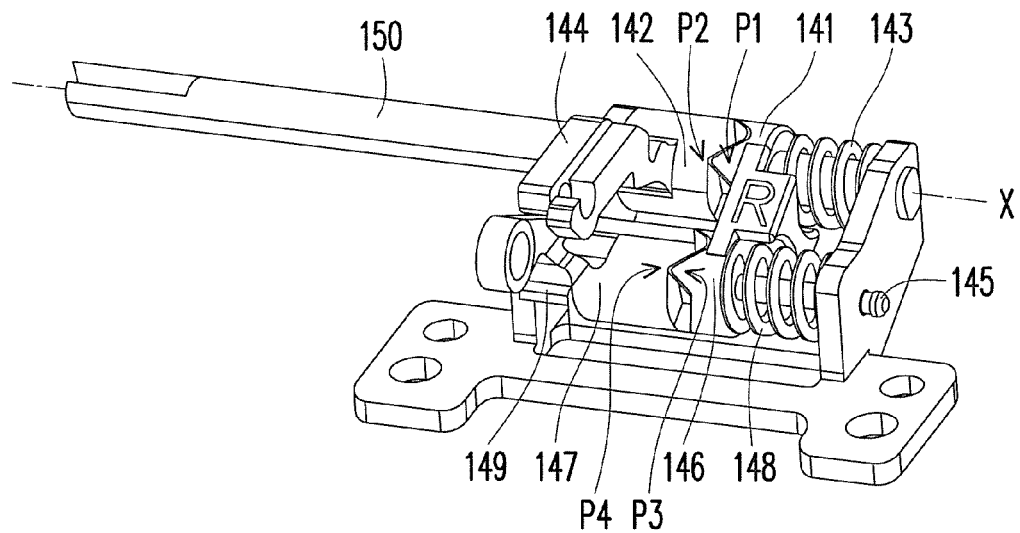
FIGS. 6A-6C are enlarged views of the rotating module corresponding to FIGS. 5B, 5C and 5D respectively.
Figure 6B:
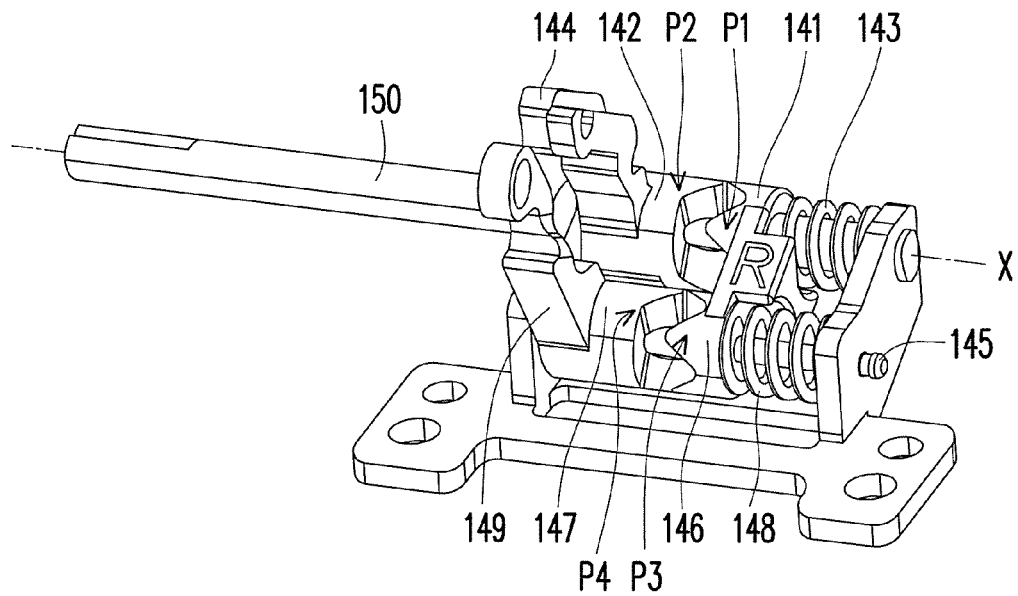
Figure 6C:
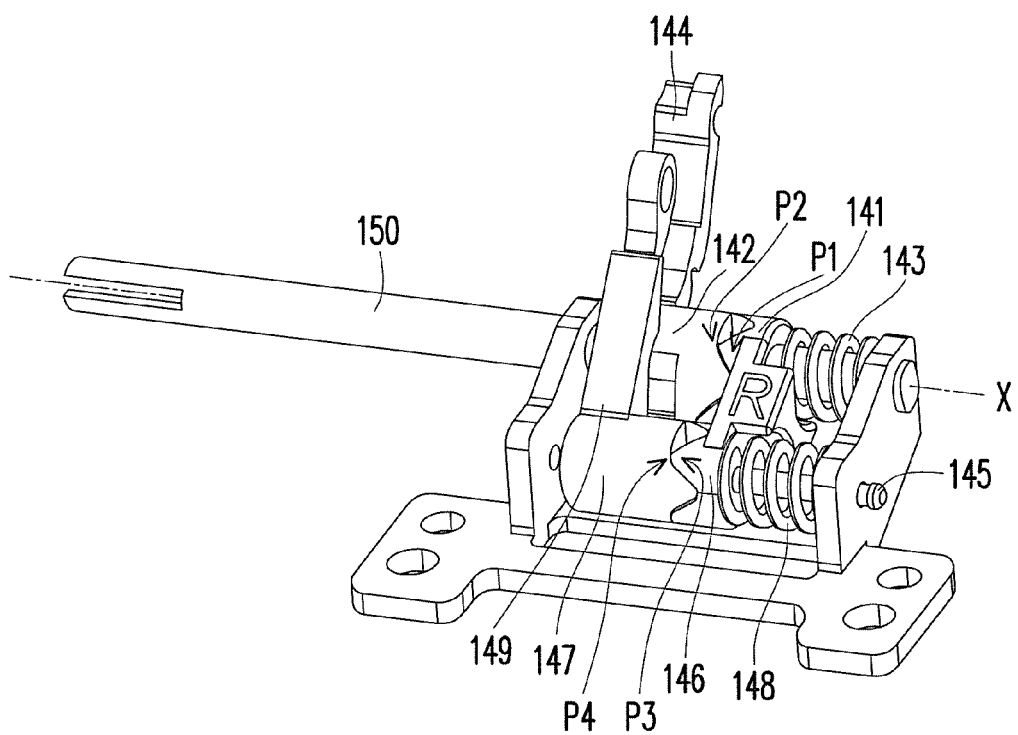

Besides, FIGS. 5A-5D illustrate the operation of the rotating module and the sliding module in the states as shown in FIGS. 4A-4D, FIGS. 6A-6C are enlarged views of the rotating module corresponding to FIGS. 5B, 5C and 5D, and FIGS. 7A-7C are enlarged views of the positioning cam and the rotating cam corresponding to FIGS. 6A-6C. The operations of the sliding module 130 and the rotating module 140 of the handheld electronic device 100 are described respectively below.

Referring to FIGS. 4A and 5A, when the handheld electronic device 100 is retracted, the second body 120 is superposed on the first body 110, and the second body 120 is situated at the first position A1.

Next, referring to FIGS. 4B and 5B, when the user applies the force F to the second body 120, the handheld electronic apparatus transforms from a retracting state into a spreading state, and the second body 120 unfolds relative to the first body 110, and the second body 120 is situated at the second position A2.

Figure 7A:
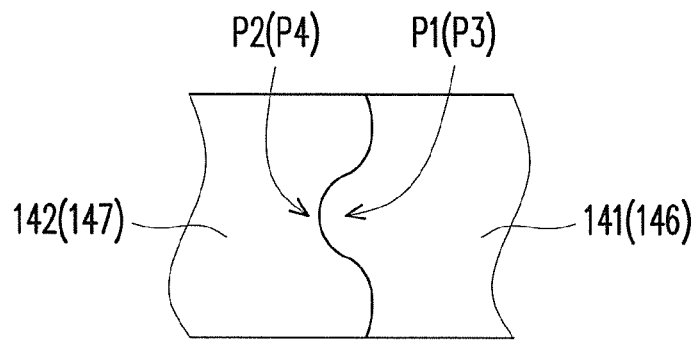
FIG. 7A-7C are enlarged views of a positioning cam and a rotating cam corresponding to FIGS. 6A-6C.

In other words, the second body 120 slides between the first position A1 and the second position A2 via the sliding module 130, in order to unfold or fold the handheld electronic device 100. Referring to FIGS. 6A and 7A, when the second body 120 is situated at the first position A1 or the second position A2, the second body 120 slides along the two grooves 132*a* of the fixing part 132 via the moving part 134, and the rotating module 140 has not begun rotating.

Then, referring to FIGS. 4B, 4C, 5B and 5C, in the embodiment, when the second body 120 is situated at the second position A2, the user may continue applying the force F to the second body 120, so that the second 120 rotates from the second position A2 to the critical position A0 via the two rotating modules 140. And the two rotating modules 140 can be actuated synchronously via the linking-up axle rod 150 by receiving the force F and store a potential.

Figure 7B:
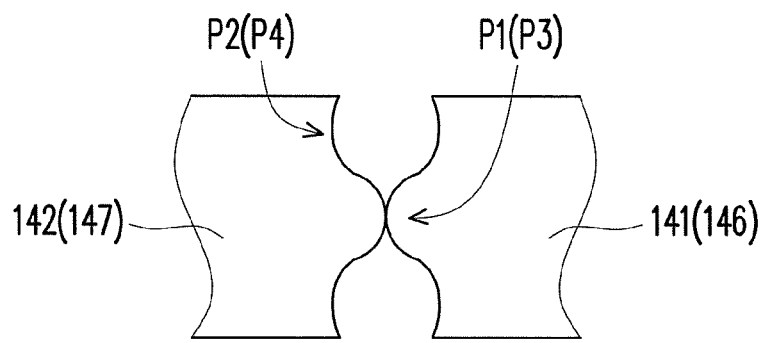

More specifically, referring to FIGS. 6B and 7B, when the second body 120 receives the force F and rotates from the second position A2 to the critical position A0, the first link rod 144 drives the first rotating cam 142 to rotate along the linking-up axle rod 150, so that the second positioning portion P2 and the first positioning portion P1 are dislocated with each other to push the first positioning cam 141 away from the first rotating cam 142 and compress the first elastic member 143 in order to store a first elastic potential energy E1.

Meanwhile, the second link rod 149 drives the second rotating cam 147 to rotate along the second axle rod 145 so that the fourth positioning portion P4 and the third positioning portion P3 are dislocated with each other to push the second positioning cam 146 away from the second rotating cam 147 and compress the second elastic member 148 to store a second elastic potential energy E2.

Next, referring to FIGS. 4C, 4D, 5C and 5D, in the embodiment, when the second body 120 receives the force F applied by the user and rotates manually via the two rotating modules 140 until the second body 120 passes the critical position A0, the two rotating module 140 are suitable for releasing the potential to drive the second body 120 together to automatically rotate to a third position A3 and form an included angle θ between the first body 110 and the second body 120.

Figure 7C:
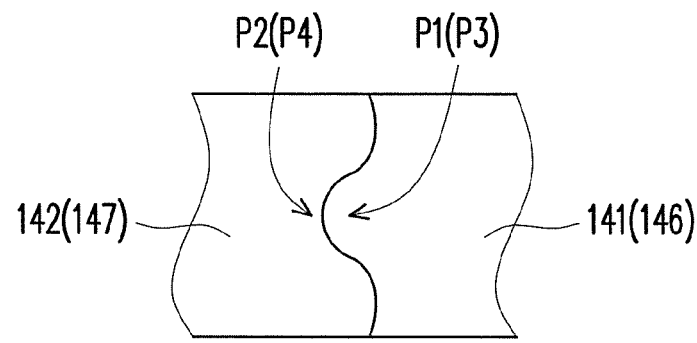

More specifically, referring to FIGS. 6C and 7C, when the second body 120 passes the critical position A0, the first elastic member 143 releases the first elastic potential energy E1 to reposition the first positioning cam 141 and drive the first positioning portion P1 and the second positioning portion P2 to a coordinated state. The first positioning cam 141 pushes the first rotating cam 142 to automatically continue rotating along the linking-up axle rod 150. The direction of the force applied to the first positioning cam 141 by the first elastic member 143 is substantially parallel to the axis X.

Meanwhile, the second elastic member 148 releases the second elastic potential energy E2 to reposition the second positioning cam 146, and to drive the third positioning portion P3 and the fourth positioning portion P4 to a coordinated state. The second positioning cam 146 pushes the second rotating cam 147 to automatically continue rotating along the second axle rod 145. The direction of the force applied to the second positioning cam 146 by the second elastic member 148 is substantially parallel to the axis X. Thereby, the first link rod 144 and the second link rod 149 drive the second body 120 together to automatically rotate from the critical position A0 to the third position A3.

In general, when the user applies the force F to the second body 120 of the handheld electronic apparatus 100, the user may move the second body 120 manually from the first position A1 to the second position A2 via the sliding module 130, so that the handheld electronic device 100 transforms from a retracting state to an spreading state, as the handheld electronic apparatus turns from the state in FIG. 4A to the state in FIG. 4B.

When the user continues applying the force F to the second body 120 of the handheld electronic apparatus 100, the user may manually rotate the second body 120 to the critical position A0 via the two rotating modules 140, as the handheld electronic apparatus turns from the state in FIG. 4B to the state in FIG. 4C. When the second body 120 passes the critical position A0, the positioning cam of the two rotating modules 140 and the released elastic potential enables the second body 120 to automatically rotate to the third position A3, as the handheld electronic apparatus transforms from the state in FIG. 4C to the state in FIG. 4D, in order to achieve the manipulation of semi-automatic rotation.

Figure 8:
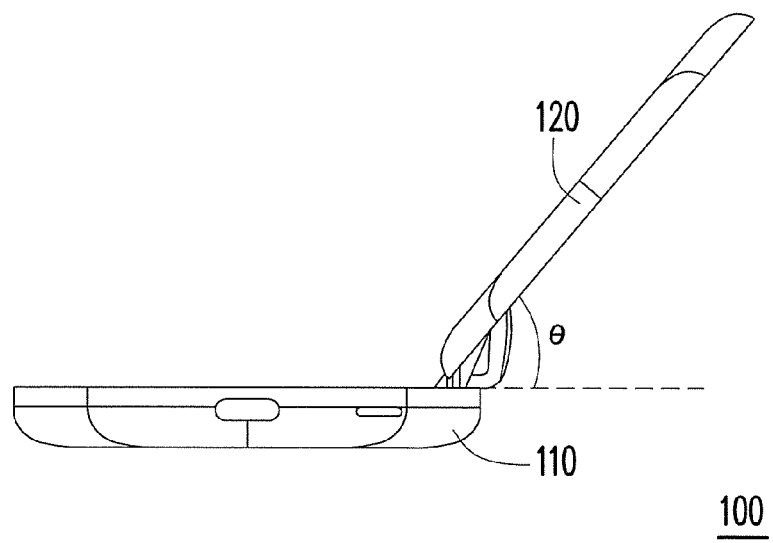
FIG. 8 illustrates a side view of the handheld electronic device in the state as shown in FIG. 4D.
Figure 9:
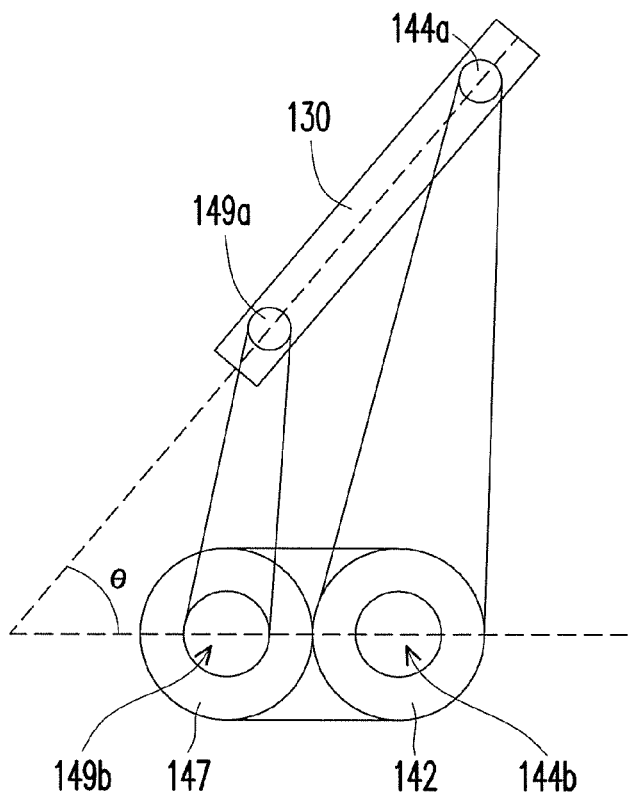
FIG. 9 illustrates a geometric relationship between the sliding module and the rotating module in the state as shown in FIG. 5D.

FIG. 8 illustrates a side view of the handheld electronic device in the state as shown in FIG. 4D, and FIG. 9 illustrates a geometric relationship between the sliding module and the rotating module in the state as shown in FIG. 5D. Referring to FIGS. 8 and 9, the first link rod 144 in the embodiment is coupled to the sliding module 130 and the first rotating cam 142 respectively via the first pivot axis 144*a* and the second pivot axis 144*b*, and the second link rod 149 is coupled to the sliding module 130 and the second rotating module 147 respectively via the third pivot axis 149*a* and the fourth pivot axis 149*b*.

The distance between the first pivot axis 144*a* and the second pivot axis 144*b* is larger than the distance between the third pivot axis 149*a* and the fourth pivot axis 149*b*. i.e. the distance from a pivot connection point of the first link rod 144 and the sliding module 130 to a pivot connection point of the first link rod 144 and the first rotating cam 142 is larger than the distance from a pivot connection point of the second link rod 149 and the sliding module 130 to a pivot connection point of the second link rod 149 and the second rotating cam 147.

In other words, when the pivot connection point of the second pivot axis 144*b* and the fourth pivot axis 149*b* with the rotating module 140 respectively are situated on the same plane, and the plane is parallel to the first body 110, the distance from the first pivot axis 144*a* to the plane is larger than the distance from the third pivot axis 149*a* to the plane, as shown in FIG. 9. Thereby, when the second body 120 is situated at the third position A3, an angle θ is formed between the first body 110 and the second body 120, so that the handheld electronic apparatus 100 has a preferable utilization angle.

In light of the above, a handheld electronic apparatus is introduced herein, wherein after spreading a second body manually via a sliding module, the user may rotate the second body manually via two rotating modules, so that the second body automatically continues rotating to an expected position via a positioning cam of the two rotating modules and a released elastic potential. Besides, the two rotating modules have a linking-up axle rod in between, so that the two rotating modules rotate synchronously to drive the second body to rotate relative to a first body without skewing. A sliding mechanism assembly is further provided herein, suitable for being coupled between two objects, so that the sliding mechanism assembly rotates semi-automatically. Thereby, the sliding mechanism assembly provides a pivot mechanism with a small volume and a simple design to the handheld electronic apparatus, so that two bodies coupled to the pivot mechanism have a smaller overlapping area, and the second body is rotated semi-automatically with a positioning function of the pivot mechanism.

Although the disclosure has been described with reference to the above embodiments, it will be apparent to one of the ordinary skill in the art that modifications and variations to the described embodiments may be made without departing from the spirit and scope of the invention. Accordingly, the scope of the disclosure will be defined by the attached claims not by the above detailed descriptions.

What is claimed is:

1. A handheld electronic device, comprising:
   a first body;
   a second body;
   a sliding module, coupled to the second body, wherein the second body is configured to slide between a first position and a second position via the sliding module; and
   at least one rotating module, coupled between the first body and the sliding module, the second body being configured to rotate relative to the first body via the at least one rotating module along an axis, wherein the second body is configured to receive a external force to rotate from the second position to a critical position, the at least one rotating module is configured to receive the force in order to store a potential energy, and the at least one rotating module is configured to release the potential energy to drive the second body to rotate from the critical position to a third position and form an included angle between the first body and the second body when the second body passes the critical position, and each rotating module comprises:
   a first axle rod, configured on the first body, wherein an extending direction of the first axle rod is parallel to the axis;
   a first positioning cam, disposed on the first axle rod, wherein the first positioning cam has a first positioning portion;
   a first rotating cam, disposed on the first axle rod, wherein the first rotating cam has a first mating surface facing the first positioning portion and a second positioning portion on the first mating surface, and the second positioning portion is configured to be coordinated with the first positioning portion;
   a first elastic member, coupled to the first positioning cam; and
   a first link rod, coupled between the first rotating cam and the sliding module, wherein when the second body rotates from the second position to the critical position, the first link rod drives the first rotating cam to rotate along the first axle rod, so that the second positioning portion and the first positioning portion are dislocated with each other to push the first positioning cam away from the first rotating cam, so that the first elastic member stores a first elastic potential energy, and when the second body passes the critical position, the first elastic member releases the first elastic potential energy to reposition the first positioning cam and drive the first positioning portion and the second positioning portion to a coordinated state, so that the first rotating cam continues rotating along the first axle rod to drive the second body to rotate from the critical position to the third position via the first link rod.

2. The handheld electronic device as claimed in claim 1, wherein each of the sliding modules further comprises:
   a second axle rod, configured on the first body, wherein an extending direction of the second axle rod is parallel to the axis;
   a second positioning cam, disposed on the second axle rod, wherein the second positioning cam has a third positioning portion;
   a second rotating cam, disposed on the second axle rod, wherein the second rotating cam has a second mating surface facing the third positioning portion and a fourth positioning portion on the second mating surface, and the fourth positioning portion is configured to be coordinated with the third positioning portion;
   a second elastic member, coupled to the second positioning cam; and
   a second link rod, coupled between the second rotating cam and the sliding module, wherein when the second body rotates from the second position to the critical position, the second link rod drives the second rotating cam to rotate along the second axle rod, so that the fourth positioning portion and the third positioning portion are dislocated with each other to push the second positioning cam away from the second rotating cam, so that the second elastic member stores a second elastic potential, and when the second body passes the critical position, the second elastic member releases the second elastic potential to reposition the second positioning cam and drive the third positioning portion and the fourth positioning portion to a coordinated state, so that the second rotating cam continues rotating along the second axle rod to drive the second body to rotate from the critical position to the third position via the second link rod and the first link rod together.

3. The handheld electronic device as claimed in claim 2, wherein the first link rod is coupled to the sliding module and the first rotating cam respectively via a first pivot axis and a second pivot axis, and the second link rod is coupled to the sliding module and the second rotating cam respectively via a third pivot axis and a fourth pivot axis, wherein a distance between the first pivot axis and the second pivot axis is larger than a distance between the third pivot axis and the fourth pivot axis.

4. The handheld electronic device as claimed in claim 2, wherein the second elastic member comprises a helical spring, disposed on the second axle rod.

5. The handheld electronic device as claimed in claim 2, wherein a direction of a force applied to the second positioning cam by the second elastic member is substantially parallel to the axis.

6. The handheld electronic device as claimed in claim 1, wherein the number of the at least one rotating module is two, arranged on two opposite sides of the first body respectively, and the two rotating modules share a same first axle rod.

7. The handheld electronic device as claimed in claim 1, wherein the first elastic member comprises a helical spring, disposed on the first axle rod.

8. The handheld electronic device as claimed in claim 1, wherein a direction of a force applied to the first positioning cam by the first elastic member is substantially parallel to the axis.

9. The handheld electronic device as claimed in claim 2, wherein the sliding module comprises:
   a fixing part, pivotally connected to the first link rod and the second link rod; and
   a moving part, connected to the second body, and slidingly coupled to the fixing part.

10. The handheld electronic device as claimed in claim 9, wherein the fixing part has two opposite grooves, and the moving part is slidingly engaged in the two grooves.

11. A handheld electronic device, comprising:
   a first body;
   a second body;
   a sliding module, coupled to the second body, wherein the second body is configured to slide between a first position and a second position via the sliding module;
   two rotating modules, arranged on two opposite sides of the first body and coupled between the first body and the sliding module, wherein the second body is configured to rotate relative to the first body via the two rotating modules along an axis; and
   a linking-up axle rod, configured on the first body and coupled to the two rotating modules, and an extending direction of the linking-up axle rod is parallel to the axis, wherein the second body is configured to receive a force in order to rotate from the second position to a critical position, and the two rotating modules are configured to be actuated synchronously via the linking-up axle rod by receiving the force and store a potential, wherein when the second body passes the critical position, the two rotating modules release the potential to drive the second body together to rotate from the critical position to a third position and form an included angle between the first body and the second body;
   wherein each of the rotating modules comprises:
   a first positioning cam, disposed on the linking-up axle rod, wherein the first positioning cam has a first positioning portion;
   a first rotating cam, disposed on the linking-up axle rod, wherein the first rotating cam has a first mating surface facing the first positioning portion and a second positioning portion on the first mating surface, the second positioning portion is configured to be coordinated with the first positioning portion;
   a first elastic member, coupled to the first positioning cam; and
   a first link rod, coupled between the first rotating cam and the sliding module, wherein when the second body rotates from the second position to the critical position, the first link rod drives the first rotating cam to rotate along the linking-up axle rod, so that the second positioning portion and the first positioning portion are dislocated with each other, in order to push the first positioning cam away from the first rotating cam, so that the first elastic member stores a first elastic potential, and when the second body passes the critical position, the first elastic member releases the first elastic potential to reposition the first positioning cam and drive the first positioning portion and the second positioning portion to a coordinated state, so that the first rotating cam continues rotating along the linking-up axle rod to drive the second body to rotate from the critical position to the third position via the first link rod.

12. The handheld electronic device as claimed in claim 11, wherein each of the sliding modules further comprises:
   a second axle rod, configured on the first body, wherein the extending direction of the second axle rod is parallel to the axis;
   a second positioning cam, disposed on the second axle rod, wherein the second positioning cam has a third positioning portion;
   a second rotating cam, disposed on the second axle rod, wherein the second rotating cam has a second mating surface facing the third positioning portion and a fourth positioning portion on the second mating surface, and the fourth positioning portion is configured to be coordinated with the third positioning portion;
   a second elastic member, coupled to the second positioning cam; and
   a second link rod, coupled between the second rotating cam and the sliding module, wherein when the second body rotates from the second position to the critical position, the second link rod drives the second rotating cam to rotate along the second axle rod, so that the fourth positioning portion and the third positioning portion are dislocated with each other to push the second positioning cam away from the second rotating cam, so that the second elastic member stores a second elastic potential, and when the second body passes the critical position, the second elastic member releases the second elastic potential to reposition the second positioning cam and drive the third positioning portion and the fourth positioning portion to a coordinated state, so that the second rotating cam continues rotating along the second axle rod to drive the second body to rotate from the critical position to the third position via the second link rod and the first link rod together.

13. The handheld electronic device as claimed in claim 12, wherein the first link rod is coupled to the sliding module and the first rotating cam respectively via a first pivot axis and a second pivot axis, and the second link rod is coupled to the sliding module and the second rotating cam respectively via a third pivot axis and a fourth pivot axis, wherein a distance between the first pivot axis and the second pivot axis is larger than a distance between the third pivot axis and the fourth pivot axis.

* * * * *